United States Patent [19]

Lettvin et al.

[11] Patent Number: 4,577,160

[45] Date of Patent: Mar. 18, 1986

[54] METHOD OF AND APPARATUS FOR LOW NOISE CURRENT AMPLIFICATION

[75] Inventors: Jerome Y. Lettvin, Cambridge; George M. Plotkin, Lynn, both of Mass.

[73] Assignee: Robert H. Rines, Concord, N.H. ; a part interest

[21] Appl. No.: 564,360

[22] Filed: Dec. 22, 1983

Related U.S. Application Data

[63] Continuation-in-part of Ser. No. 455,305, Jan. 3, 1983, abandoned.

[51] Int. Cl.$^4$ .............................................. H03F 1/26
[52] U.S. Cl. ................................... 330/149; 330/257; 330/261; 330/293; 330/295; 360/67
[58] Field of Search ............... 330/146, 149, 98, 100, 330/257, 261, 260, 262, 295, 293, 311; 360/67

[56] References Cited

U.S. PATENT DOCUMENTS

| | | | |
|---|---|---|---|
| 2,760,007 | 8/1956 | Lozier | 330/293 |
| 3,317,681 | 5/1967 | Guisinger | 360/67 |
| 3,585,315 | 6/1971 | Shaifer | 360/67 |
| 4,147,992 | 4/1979 | Davis | 330/293 X |
| 4,470,020 | 9/1984 | Mohr | 360/67 X |

OTHER PUBLICATIONS

Foord, A., "Introduction to Low-Noise Amplifier Design", *Wireless World,* Apr. 1981, pp. 71–73.

*Primary Examiner*—James B. Mullins
*Attorney, Agent, or Firm*—Rines and Rines, Shapiro and Shapiro

[57] ABSTRACT

This disclosure is concerned with novel techniques and circuit configurations for rendering high gain operational amplifiers and related differencing amplifiers adaptable for use with very low impedance signal sources to permit amplification of low-power signals with ultra-low noise, high D. C. stability, high gain, and wide frequency response, through development of the signal current as a very small increment on a much larger pre-existing current forced in opposite directions through an electronic switching device connected to such amplifier and producing minimal uncorrelated noise therein.

27 Claims, 20 Drawing Figures

METHOD OF AND APPARATUS FOR LOW NOISE CURRENT AMPLIFICATION

This is a continuation-in-part application of Ser. No. 455,305, filed Jan. 3, 1983, now abandoned.

The present invention relates to methods of and apparatus for low-noise signal current amplification, being more particularly, though not exclusively, directed to the conversion of high gain operational amplifiers and the like into low-noise inverting amplifiers of high D.C. stability, high gain and wide frequency response.

Prior art techniques for low-noise amplification of signal currents with the aid of amplifier electron tubes, solid-state amplifiers such as transistors and the like, and other types of amplifying relay devices, all hereinafter sometimes generically referred to as electronic switching devices, have largely relied upon the use of a series element to develop the input signal current as a voltage, inherently thereby degenerating the signal capabilities of the device. The conventional approach to low noise circuitry is to use, for example, a single transistor with grounded emitter, and to introduce the signal by means of a voltage at the base. As an illustration, to record from a moving coil signal source, one uses a damping resistor across it and the voltage generated across the resistance is the signal. But, in using such inputs as, e.g. those of moving coil cartridges and the like, it is clear that the use of a damping resistor corrupts the possible signal to be had by operating the coil as a pure current generator, (or even as a purely inductive generator when the coil resistance is cancelled by a series negative resistance). The same is true of any low impedance, low power signal device. Prior approaches to low-noise amplification are described, for example, in *Wireless World*, April 1981, "Introduction to Low-Noise Amplifier Design", A. Foord, pages 71-73.

In accordance with the philosophy underlying the discoveries of the present invention, on the other hand, electronic switching devices or amplifiers are operated to measure current rather than voltage, and to do so with a novel superposition of signal from a low input impedance source upon much larger opposing balancing currents passed from a common preferably constant current source in opposite directions through the electronic switching device—this technique having been found to result in the lowest possible noise in such amplifying circuits.

An object of the present invention, accordingly, is to provide a new and improved method of low noise amplification and, more particularly, a novel method of and apparatus for low-noise signal current amplification.

A further object is to provide a novel method of and apparatus circuit for converting high gain operational amplifiers and the like into low noise current amplifiers of low input impedance, high D.C. stability and high gain, together with wide frequency response.

An additional object is to provide novel amplifying techniques and apparatus for amplification that are adapted for use with a myriad of prior art types of components and circuits to provide highly improved low-noise operation and other benefits.

Other and further objects will be explained hereinafter and are more particularly delineated in the appended claims.

In summary, however, from one of its broader aspects, the invention embraces in an electronic amplifier apparatus comprising a differencing amplifier circuit connected to receive signal from and to feedback to an electronic switching device, a method of enabling low noise current amplification of a signal from low impedance source means, that comprises, passing equal but opposite currents with the same correlated noise from a common source in opposite directions through the switching device to produce minimal resultant uncorrelated noise therein, and superimposing the signal from said low impedance source means as an increment to the current through said device of magnitude much smaller than said opposite currents. Preferred details and best mode embodiments are later presented.

The invention will now be described with reference to the accompanying drawings

FIGS. 3 and 4 are circuit diagrams of further modified circuits run from a power supply, illustrating the application of the invention in more practical form and useful with three-terminal electronic switching devices or other transconductance relays or the like;

FIG. 5 is the symbol for such a circuit, considered as an element with two input terminals and one output terminal, while FIG. 12 shows a pair of these circuits arranged so that the signal current generator (e.g. a "moving coil" transducer) can be connected directly there between;

FIGS. 8 and 9 each illustrates a plurality of electronic switching devices or relays useful, respectively, with the apparatus of the circuits of FIG. 3 and FIGS. 6 and 7;

FIGS. 13A, B and C are circuits using the general configuration of FIG. 5 particularly adapted for use with low-resistance signal coils such as those of moving-coil cartridges and the like;

FIG. 14 is a further modification illustrating how a "negative" resistance can be generated to cancel the equivalent series resistance of a coil so as to treat the coil as a pure inductance;

FIG. 15 is a modified circuit configuration involving impedances that allow active filters to be made in the range of operation of the device.

Figure 3:
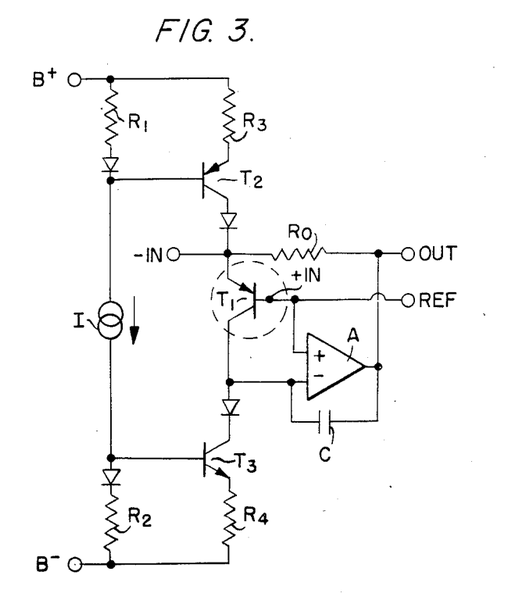
Figure 4:
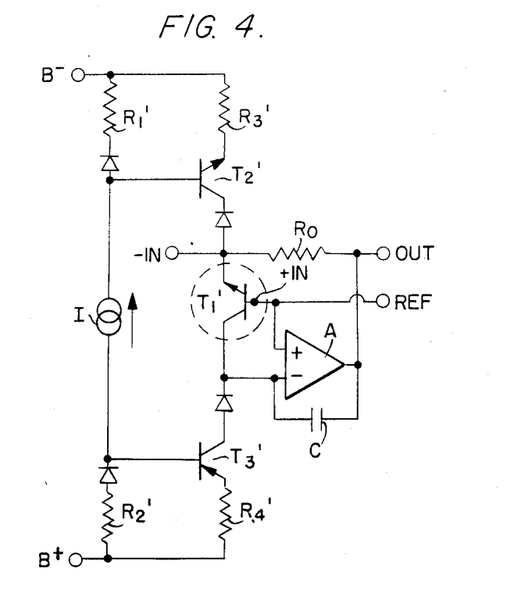

Referring to the drawings, as above indicated, FIGS. 3 and 4 are complementary versions of circuits embodying electronic switching transistors $T_1$ or $T_1'$ fed equal and opposite currents from a constant current source I and connected to a differencing amplifier, such as an operational amplifier A, with feedback from its output ("OUT") through resistance $R_o$ to the emitter $T_1$ or $T_1'$. For an understanding of the operation, reference is made to the explanatory diagrams of FIGS. 1A and 1B.

Figure 1A:
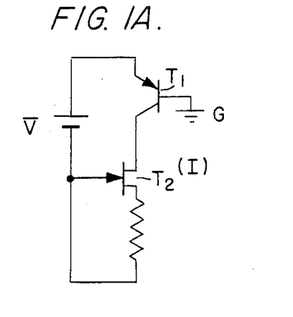
FIGS. 1A and 1B of which are schematic circuit diagrams explanatory of the underlying techniques and operation of the invention.

In FIG. 1A, the current generator I is shown implemented by the FET $T_2$, being connected in circuit with a D.C. source v and the transistor switching device $T_1$, shown with base grounded at G. No possible current can flow except leakages which can be assumed to be less than $10^{-10}$ amps. Thus the drain-source voltage of $T_2$ will be zero and the gate-source voltage will also be zero so that the drain-source resistance is low.

Figure 1B:
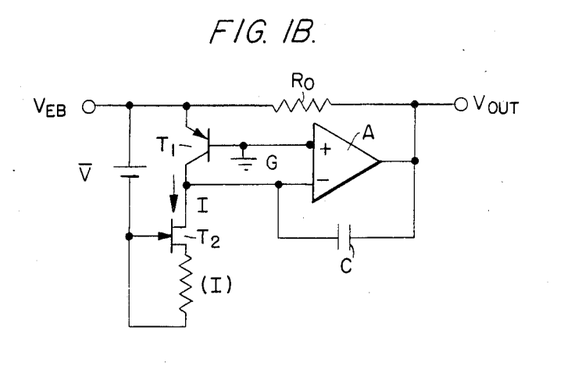

This system is connected to a differencing amplifier as illustrated in FIG. 1B. The differencing amplifier preferably has a high input impedance (i.e. has an FET first stage) and has its + input connected to the grounded base of $T_1$, its − input connected to the collector thereof, and its phase-inverting output fed back through $R_o$ to the emitter of $T_1$. The input signal $V_{eb}$, as from a very low impedance source (such as the coil sensors before discussed and the like), is applied to the emitter but is independent of the "floating" current, and the signal current passed through $T_1$ is of magnitude small compared to the equal and opposite currents forced from the constant current generator or source I into the emitter and collector of $T_1$. It should be noted that these equal and opposite currents fed at the emitter and collector through $T_1$ are noise-correlated by virtue of the common source. This results in minimal uncorrelated and uncancelled noise therein; and thus with the signal current applied between emitter and base ($I_{eb}$) being superimposed as a tiny increment much smaller than such currents lying above the noise current of $T_1$, there is generated an output amplified signal $V_{OUT}$ of the operational amplifier A that is proportional thereto with very low noise.

Specifically, with the circuit of FIG. 1B, the output voltage $V_{OUT}$ rises until $$\frac{V_{OUT} - V_{eb}}{R_o} = I_{eb} = \frac{I}{\beta}$$

where $\beta$ is the amplification factor of $T_1$. Once $T_1$ is turned on, the emitter-collector current $I_{ec}$ is that of the current source I; that is, $I_{ec} = I$, and is unaffected in principle by the signal current $I_{eb}$. In fact, however, there is some leakage between collector and base, but none of it flows, since by the feed-back clamping, the voltage between collector and base $V_{cb} \cong 0$. Under these conditions, the voltage gain is $$\frac{d(V_{ec})}{d(V_{eb})} \cong 10^4$$

with most low-level transistors, insofar as that gain can be measured directly. The gain of the operational amplifier A is $\sim 10^5$ so that the open-loop gain is $\sim 10^9$. For this reason, C is used between the output and input terminal − of A to prevent parasitic oscillations.

With no input, as it stands, if the collector were grounded to the base, the resistance of emitter-to-ground is $$\frac{V_T}{I}, \text{ where } V_T = \frac{KT}{q} \cong 26 \text{ mv}$$

at room temperature. Then the system would be an inverting amplifier with a V gain of $$\frac{(R)(I)}{26 \text{ mv}}.$$

But the great gain of $T_1$ changes all that, even though $V_{ec}$ is clamped to $V_{eb}$. The effective input resistance at the emitter of $T_1$ is well below 0.001 ohm by calculation and by practice, so that the emitter is quite as good a ground as one end of a short stout copper wire whose other end is grounded, effectively short-circuiting the before-mentioned coil sensor or other very low impedance signal source represented by $V_{eb}$ applied between emitter and grounded base of $T_1'$.

Equally gratifying is the noise of the device. As second stage, the operational amplifier A contributes negligibly because of the gain of the first stage $T_1$. At the same time, the current between emitter and collector of $T_1$ contributes only by the correlated noise of $T_2$ divided by $h_{fe}$, with such noise being relatively low in the first place—so it contributes little if $h_{fe} \sim 100$. What is left is the noise of the equivalent resistance $R_e$ through the emitter plus the base spreading resistance $R_{bb}'$. In good bipolar transistors, for example, $R_{bb}' < 5$ ohms and $R_e = (b\ 26\ \text{mv})/i$, so that the equivalent resistance from which to calculate the noise is $<13$ ohms if $I_{ce} \geq 3$ ma.

This technique thus enables substantially pure current amplification with substantially no voltage-induced noise, particularly, though by no means exclusively, useful with the before mentioned very low impedance signal sources of 20 ohms or less. Effectively all of the base, emitter and collector electrodes are clamped (the base, to ground), and the switching device operates in a pure current mode with the noise of only the emitter junction and the base spreading resistance; and with output gain of any desired value (such as the before-mentioned loop gain at about $10^9$). The current through the switching device effectively never changes significantly because of the feedback.

This is thus a general way of converting any high gain operational amplifier into a low-noise signal current amplifier of high D.C. stability and high gain together with wide frequency response. It replaces signal transformers, bettering them in noise and contributing negligible phase shift over a very wide band.

Figure 2A:
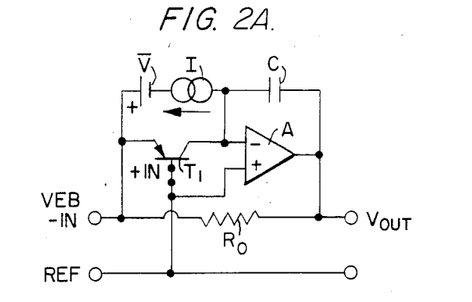
FIGS. 2A and 2B are similar diagrams of preferred elemental-form circuits illustrating the method and type of apparatus useful for the practice of the invention using transistors of complementary form.
Figure 2B:
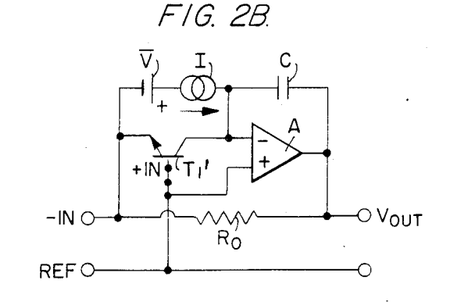

Displayed in FIG. 2A and FIG. 2B are two complementary versions of the circuit illustrating the same topology of the invention. Again, the same two independent currents are created, that between collector and emitter of $T_1$ (or $T_1'$ in FIG. 2B) and that between base and emitter. By using a floating current generator I for the collector-emitter current, it not only is insured that such remains constant, but that it cannot affect the base current. Any signal current applied between emitter and base can only flow through that junction and so permits making a common-base amplifier instead of the conventional common-emitter amplifier.

The open-loop gain, being about $10^8$–$10^9$, the closed loop behavoir at a gain of 1000 or less is not only linear over the permitted dynamic range of the operational amplifier A, but has the frequency response of the operational amplifier. Under suitable choice of C, the high frequency response can be tailored. It should be noted that the emitter and collector are protected by diode action so that no reverse currents can ever flow through the junctions.

Figure 6:
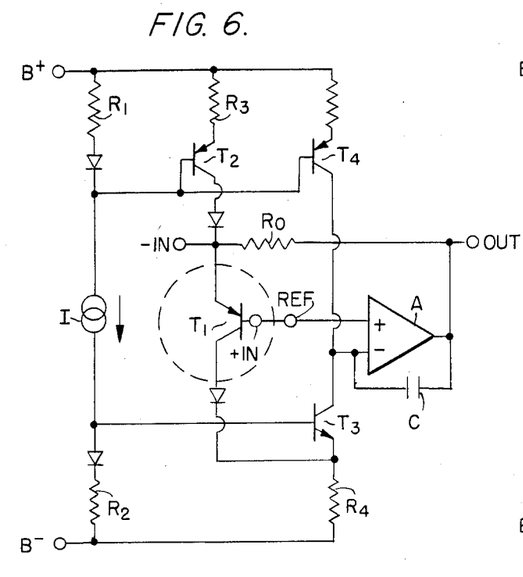
FIGS. 6 and 7 are cascode-type circuit modifications useful with operational amplifiers and the like and also embodying the basic circuit topology and methodology of the invention.
Figure 7:
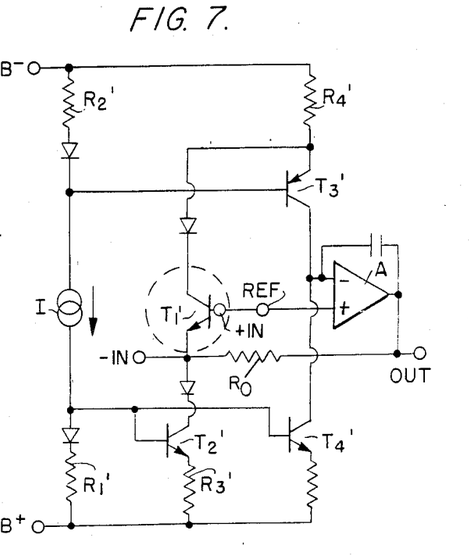

Any three-terminal electronic switching configuration, characterized by a transconductance, can be used for the purpose of the invention if not directly for $T_1$ in the circuits of FIGS. 3 and 4, by the equivalent arrangements shown by FIGS. 6 and 7. Thus, FET's, MOSFET's, thermionic devices, and all manner of cascode combinations of them can be accommodated, either by a voltage offset of +IN of the operational amplifier A from REF (such as ground) in FIGS. 3 and 4, or by the arrangements of FIGS. 6 and 7. FIGS. 3 and 4 are complementary versions of modified circuits wherein the circuits $T_1-A$ and $T_1'-A$ of respective FIGS. 2A and 2B are fed from the source I through a complementary pair of transistors $T_2$ and $T_3$ (or $T_2'$, $T_3'$ in FIG. 4) with appropriate reverse diode-protected power supply voltage resistor networks $R_1$, $R_2$, $R_3$, $R_4$ (or $R_1'-R_4'$). Preferably $R_1=R_2$ so that with $R_3=R_4$, there is a substantial part of the current passing through $T_1$ that is completely correlated in noise since there is only a unitary source of current I. The uncorrelated part due to $R_1$ and $R_2$ and $R_3$ and $R_4$ being separate elements contributes noise well below the level of the input noise of the circuit. The effective symmetric current reflector action provided by the network resistors insures that the noise of the power supply is profoundly attenuated. The larger the resistances in the reflector circuits, the less uncorrelated noise is generated, with the correlated noise being cancelled as before explained.

In the embodiment of FIG. 6, as distinguished from FIG. 3, a further stage $T_4$ is employed with its collector connected with that of $T_3$ and to the − input of the operational amplifier A, with the emitter of $T_3$ connected to the collector of $T_1$. This provides for the collector current of $T_1$ to be applied through the emitter of $T_3$ and the resulting collector current $T_3$ to be pitted against a reflected or inverted current from the same constant current source. FIG. 7 illustrates the complementary version thereof. There circuits are used when the voltage of the drain of an FET or the plate of a triode must be offset from the REF voltage by a definite amount.

Figures 8, 9, 13C, 14, 15:
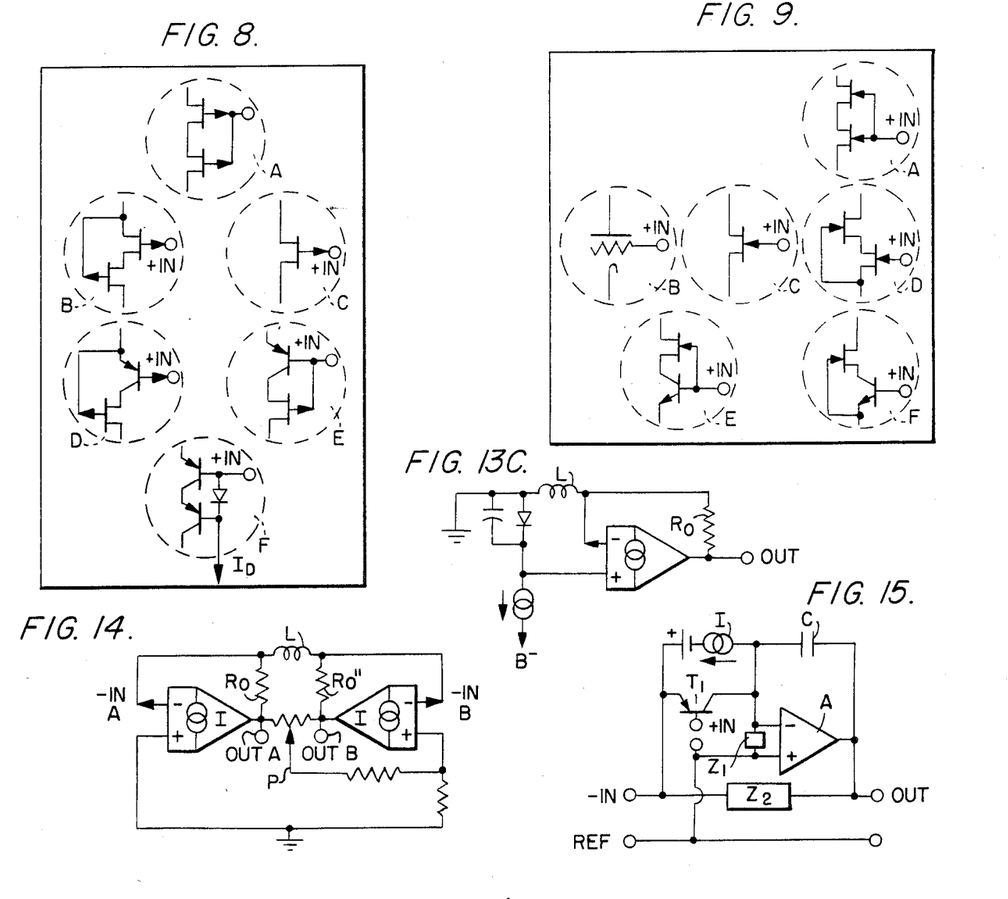

Other types of electronic switching devices $T_1$ (or $T_1'$) useful with this technique are shown in FIGS. 8A-F (or FIGS. 9A-F), embodying various FET, transistor, electron tube and cascode arrangements thereof; with the devices of FIG. 8 being useful in circuit configurations such as those of FIGS. 3 and 6, and the devices of FIG. 9 being useful with circuits as represented in FIGS. 4 and 7. The reference to electrodes herein such as base, collector and emitter types for solid state transistor devices is thus intended to describe in a generic way equivalent or similar electrodes of other solid state, electron tube or related electronic switching devices.

Figure 10:
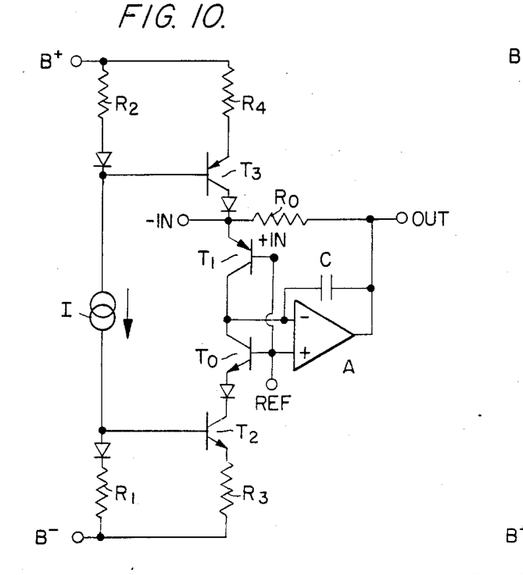
FIGS. 10 and 11 are similar circuits embodying protective circuits for limiting the + and − input differential excursions applied to the operational amplifiers or similar components.
Figure 11:
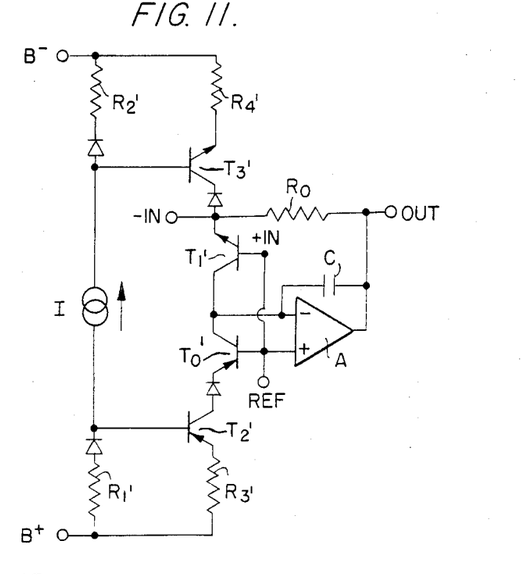

For some operational amplifiers it is desirable to limit the differential excursions of the + and − inputs, which can be done by such devices as protective diodes or the circuit variants of FIGS. 10 and 11, wherein supplemental complementary transistor stages $T_0$ and $T_0'$ are inserted in the respective circuits of FIGS. 3 and 4. The collectors of the complementary stages are connected together as are the bases, with equal and opposite current fed to the symmetrical but complementary emitters.

Figure 5:
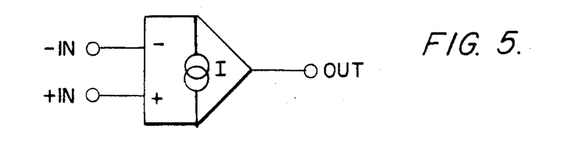
Figure 12:
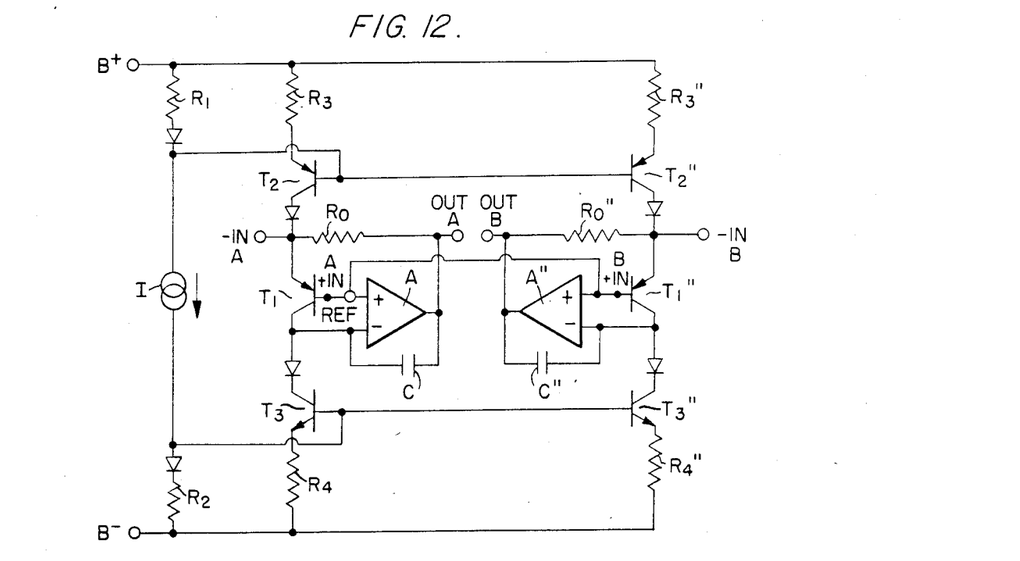

FIG. 5 is a schematic representation of a single current source using a pair of electronic transistor switching-operational amplifier circuits of the invention, with the arrow at −IN (as in FIG. 13) diagrammatically indicating whether the emitter is "P" or "N". The explicit circuit so schematically represented in FIG. 5 is illustrated in FIG. 12 in connection with switching-operational amplifier circuits of the type shown in FIG. 3, with its power supply resistor voltage networks $R_1-R_4$. Two such are shown in FIG. 12 as $T_2-T_1-A-T_3$ and $T_2''-T_1''-A''-T_3''$ with the former having signal input −IN A and output OUT A, and the latter, signal input −IN B and output OUT B. When power supply resistor $R_3$ is so adjusted slightly less than $R_4$, whatever current flows into the emitter is $I+I_{eb}$, while the current that flows from the collector is I. $V_{OUT}$ can be readily brought to 0 volts $\pm 10$ $\mu$V. Since the currents through $T_1$ or $T_1''$ never appreciably change during operation, nor the voltage across them, the system is quite thermally stable in paired operation as in FIG. 12. Such a system is particularly adapted for use with low impedance sensors such as the before-mentioned low resistance coils as of the moving-coil cartridge type or similar devices. Both operational amplifiers are shown with common reference (REF) input, but with the two REF inputs capable of having a voltage difference between them.

Figure 13A:
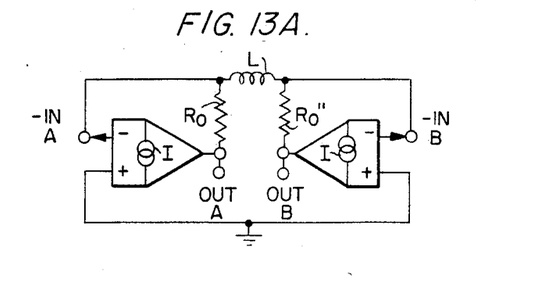
Figure 13B:
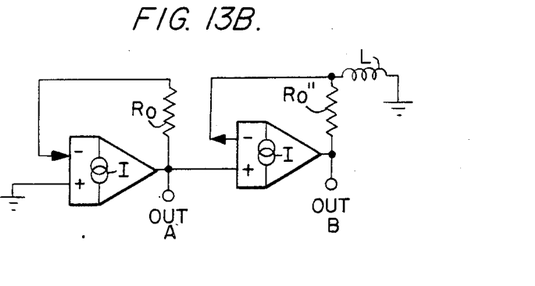

FIGS. 13A, B and C employ the schematic representation of FIG. 5 to show such use to record from coil sensors or signal sources designated by L. FIG. 13A is preferable since it provides less noise than the grounded coil terminal embodiment of FIG. 13B. FIG. 13C represents a good compromise using a single circuit of the FIG. 5 type with a grounded-terminal coil L.

FIG. 14 shows a circuit similar to FIG. 13A which enables the +IN of the device to be connected so as to put an equivalent resistance, varying from +r to −r in series with the coil through the network P.

The topology of the invention has another unique feature. By using emitter injection of current, the collector voltage swing is directly controlled instead of requiring an amplifying stage. This preserves phase even at very high frequencies. For example, at 3 ma for I, and 30 pfd for C, the system has been found to be completely stable with a slew rate of the operational amplifier A almost indistinguishable from its normal slew rate at unity gain. Practically speaking, when run at a current I of the order of 3 ma, the circuits of the invention have a voltage noise referred from output to input, of about 0.6 $\mu V/\sqrt{HZ}$ between 10 Hz and 100 KHz, corresponding to that of about 10-12$\Omega$. This suggests that the $R_{bb}'$ of the PNP transistors is about 3-5$\Omega$, which are as they are specified. The noise measure can be reduced much further by using several transistors in parallel at $T_1$. Then the noise drops by $\sqrt{n}$, where n is the number used.

The circuits of the invention, moreover, are not limited to working only with feed-back resistance (Ro). Two impedances $Z_1$ and $Z_2$ can be used, as in FIG. 15, to extend the high frequency range or to provide other special operations, such as that of active filters.

Operation of circuits as shown in FIG. 3 and other embodiments has demonstrated successful use with low impedance signal devices of input resistance less than 10 ohms producing signal amplification with noise (at 3 ma current) of ~0.6 nanovolts/$\sqrt{Hz}$ from 10 Hz to 1 megahertz and with a drift over several weeks of $\pm 10$ $\mu$V. Linear dynamic range greater than 130 db has been obtained with frequency response from D.C. to the megahertz range.

Figure 16:
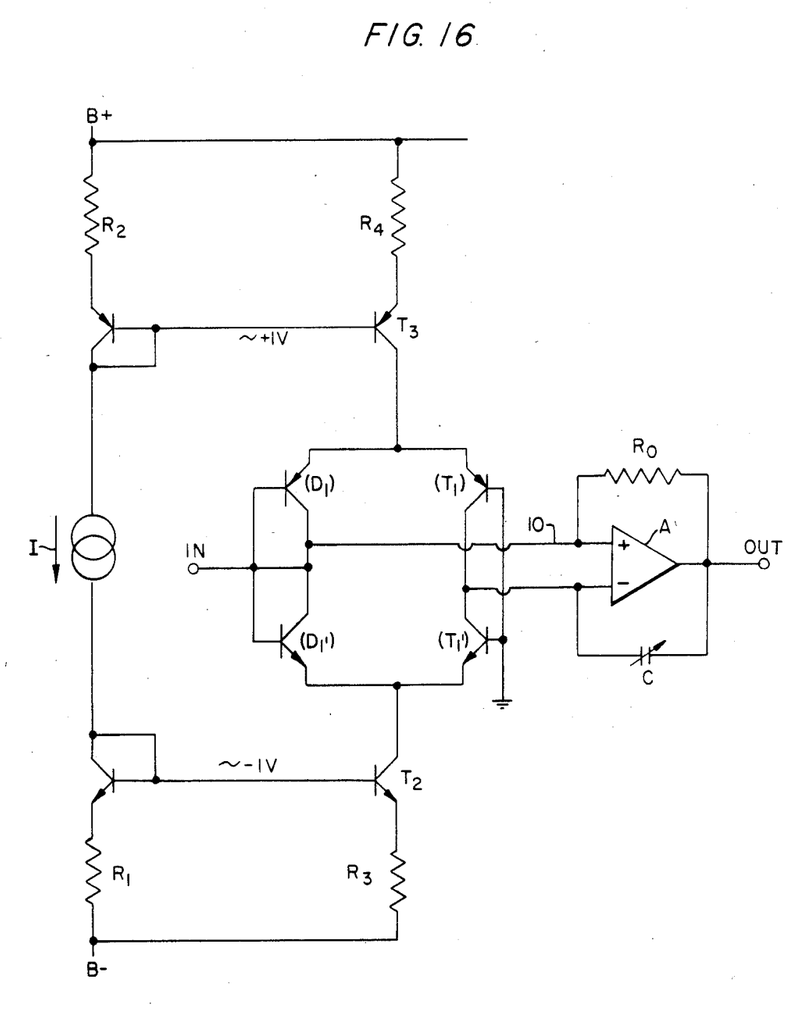
FIG. 16 is similar diagram of a modified circuit permitting grounding of the sensor input.

The modification of FIG. 16 is somewhat like that of FIG. 11 but allows the input to be at ground level by use of a pair of symmetrical sub-circuits that enable reduction of the noise of a single dual sub-circuit by 3 db. The complementary series-connected diodes $D_1$ and $D_1'$ (collectors and bases strapped together) allow such symmetrical ground level input from the sensor or transducers or other low impedance signal source to the emitters of this complementary pair of series-connected switching transistors $T_1$ and $T_1'$ across which $D_1$ and $D_1'$ are shunted. A most unconventional feedback is employed of $R_O$ from the output OUT to the non-inverting input + of the operational amplifier A and which is directly connected by 10 to the sensor or other input IN. This diminishes drift (minimal as it may be) more than if the non-inverting input were tied to ground (or other reference) as in FIG. 11. Additional paralleled stages $T_3$ and $T_2$ may also be employed, if desired.

The invention thus, in effect, replaces signal transformers, bettering them in noise and contributing negligible phase shift over a very wide band. Not only is it useful in converting differencing amplifier circuits such as operational amplifiers or low input impedance, with high D.C. stability and gain over wide frequency responses, but it is particularly useful more generally for amplification of currents generated by coils across which the magnetic field is changing. Examples of such are signal sources or sensors of the moving coil cartridge type (as of the designs used in phonograph apparatus), ribbon microphones, and coils used in sensors or detectors of various scientific, biological and medical instruments and the like. The invention also provides for amplification of low currents or low-power signals generated by low-impedance devices (low-power signals) such as thermocouples, photo-current generators, strain and pressure transducers, bioelectric signal sensors such as used in EKG's, muscle activity detectors as in electromyograms, electroretinograms, etc. The principles of the invention are further useful to provide very linear high-power amplifiers, for use as FM receiver and other front ends and low-noise antenna pick-ups or terminals, enabling improvement in weak signal reception as a result of low antenna impedance matching in a current mode. Improvements in audio and stereo amplification, in low-noise power supply performance, in current driving from constant current sources and the like are other useful applications of the invention. The invention, moreover, provides a rather universal design for inverting mode amplifiers generally, well-suited to fabrication in solid-state chip form, also enabling wide use for active filter purposes.

While the invention is not dependent upon any particular theory of operation, it being sufficient to describe, as above, the circuits and adjustments required to produce the novel results thereof, it is believed that the reason for the unusual performance of the invention is the effective operation of the circuits as a substantially perfect electronic ammeter connected across and substantially short-circuiting the moving coil sensor or transducer or other low impedance signal source, as before described. Such moving coil or conductor low impedance transducers or sensors, as they move in a uniform magnetic field with a particular velocity in response to a signal, permit of recording from this coil or conductor either by open circuit mode, in which case the voltage is recorded, or by short-circuited mode, in which case the current is recorded. In using the latter mode, as in the present invention, the sensor moving coil or conductor, as it moves in the magnetic field, brings to bear the condition of Lenz's law, setting up its own counter magnetic field as a result of the short-circuited operation, diminishing the field immediately behind it and thereby setting up conditions that impede its own progress, achieving a limiting or terminal velocity that is proportionate to the applied signal force, and with such limiting or terminal velocity being created immediately upon the application of the force. In other words, the moving wire cannot coast along under momentum but is damped and stops the moment the force ceases to be applied. Such feedback forces the limiting or terminal velocity such that the operation is analogous or equivalent to the negative feedback in an op-amp itself which reduces the excursion of the input in order both to linearize the device and extend its bandwith. The dynamic range is enormously increased because of dealing with fractional increments of what formerly were large magnitudes, and no one part of the coil or conductor can move faster than any other part because of the inherent damping, somewhat comparable to vibrating a string or dropping a ball in a container of viscous honey. Harmonic distortion is ruled out because forces are always in balance and no electrical storage (capacitive or otherwise) can exist; but the signal has nonetheless been read as the total power of the signal is absorbed in this damping (of course, with heat generation). Thus, unlike open-circuited measuring techniques wherein some index of the actual signal power is employed for measurement, such as a representative voltage or current indicative of the same, the operation of the invention involves direct measurement of the total signal power itself. The circuits of the invention are connected across such moving conductor type sensors in a magnetic field effectively to short circuit the sensor conductor and thereby cause counter-magnetic field generation dissipation of all of the signal power that is applied to the sensor and in so doing drain all of the signal driving power, such directly measuring the power applied by the signal. It should also be remarked that the first stage (such as $T_1$, etc.) of the circuit of the invention which is short-circuiting the sensor should not be construed as analogous to conventional power amplifiers and the like, in that it merely allows the sensor-developed current that flows to generate, in effect, its own phenomenon, with no power amplification, and with the circuit contributing no current at all.

Further modifications will also occur to those skilled in this art and such are considered to fall within the spirit and scope of the invention as defined in the appended claims.

What is claimed is:

1. In an electronic amplifier apparatus comprising a differencing amplifier circuit connected to receive signal from and to feedback to an electronic switching device, a method of enabling low-noise current amplification of a signal from low impedance source means, that comprises, passing equal but opposite currents with the correlated noise from a common source in opposite directions through the switching device to produce minimal resultant uncorrelated noise therein, and superimposing the signal from said low impedance source means as an increment to the current through said device of magnitude much smaller than said opposite currents.

2. A method is claimed in claim 1 and in which said passing of equal but opposite currents through the switching device comprises passing through the switching device current that is generated by said source and current that is inverted by said differencing amplifier circuit and fed back to said switching device.

3. A method is claimed in claim 2 and in which said passing of equal and opposite currents through the switching device is maintained so that the current in the switching device does not change substantially during operation.

4. A method is claimed in claim 3 and in which said superimposing of signal comprises superimposing a signal current of the order of a millionth of the current passed through the switching device.

5. A method is claimed in claim 1 and in which said superimposing of signal comprises injecting a signal current with respect to a noiseless reference.

6. A method of providing substantially pure current amplification with ultra-low noise for low-power signals from a low impedance source, that comprises, applying equal and opposite current with the same noise from a constant current source to the emitter and collector of a solid-state electronic switching device operating with a grounded base to force the equal and opposite currents to cancel correlated noise therein; connecting an operational amplifier having positive and negative input terminals and an output terminal, with its positive terminal connected to the base and its negative terminal to the collector of said device; connecting the said output terminal of the operational amplifier through feedback impedance to the emitter of said device; connecting a low impedance signal source to the emitter to superimpose a signal current from the signal source above the noise current of the said device and of magnitude very much smaller than the forced current through the device to generate a proportional signal at the output terminal of the operational amplifier, such that said signal current injected at the emitter is amplified with very low noise.

7. A low noise amplifier apparatus having, in combination, differencing amplifier means having inputs and an output; electronic switching means having at least three electrodes comprising input and output terminals; means for connecting the said output terminals to the inputs of the amplifier means with a feedback connection from the output of the amplifier means to the input terminals of the electronic switching means; means for applying equal and opposite currents to the input and output terminals of the switching means from a common source to force equal and opposite currents with the same correlated noise in opposite directions through the switching means to produce minimal resultant uncorrelated noise therein; and means for connecting a low impedance signal source with the input terminals of the switching means to superimpose a signal as an increment to the currents forced through said switching means of magnitude much smaller than said opposite current for low-noise amplification by the amplifier means.

8. Apparatus as claimed in claim 7 and in which the magnitude of the signal is of the order of a millionth of the said opposite currents forced through said switching means.

9. Apparatus as claimed in claim 7 and in which said electronic switching means comprises a solid state device having electrodes of the base, collector and emitter types and said amplifier means comprises an operational amplifier type circuit; said means for applying equal and opposite currents forcing said currents through said device between emitter and collector with said base grounded; and said means for connecting the low impedance signal source connecting the same to the emitter.

10. Apparatus as claimed in claim 9 and in which a feedback path is connected between the output of the operational amplifier ad the emitter of said device.

11. Apparatus as claimed in claim 10 and in which capacitance is connected between the output of the operational amplifier and the collector of said device.

12. Apparatus as claimed in claim 11 and in which one of the said inputs of the amplifier is a positive input connected to the base of the said device and another of said inputs is a negative input connected to the collector.

13. Apparatus as claimed in claim 11 and in which further transistor means is connected between the said device and the inputs of said operational amplifier to limit the differential excursions thereof.

14. Apparatus as claimed in claim 9 and in which said common source comprises a power supply with means for applying equal and opposite currents to the emitter and collector of said device.

15. Apparatus as claimed in claim 14 and in which said switching device is connected with a complementary solid-state switching device with collectors connected together and bases connected together and with the emitters connected to receive said opposite currents.

16. Apparatus as claimed in claim 9 and in which said emitter and collector are clamped and the base is also clamped to ground, with said device operating in a pure current mode with substantially only the noise of the emitter function.

17. Apparatus as claimed in claim 7 and in which said electronic switching means comprises a pair of series-connected complementary electronic switches shunted by series-connected complementary diodes effectively bringing to ground level the input terminals from said low-impedance signal source.

18. Apparatus as claimed in claim 17 and in which electronic switches comprise series-connected transistors the bases of which are grounded, with a point of series connection of the said diodes effectively holding the other input terminal of said signal source at ground.

19. Apparatus as claimed in claim 18 and in which said feedback connection from the said output of the said amplifier means is connected from said output to the positive input of said amplifier means and to said point of series connection of the said diodes.

20. Apparatus as claimed in claim 19 and in which said output of said amplifier means is capacitively connected to the negative input of said amplifier means and to the point of series connection of the collectors of the said series-connected electronic switches.

21. A method of low noise current amplification of a signal from low impedance source means of the signal sensor type having a moving conductor in a magnetic field, that comprises, applying signal forces to said signal sensor to move the conductor in said magnetic field in response to the signal forces, connecting a current receiving circuit across the sensor effectively to short circuit the same, and providing a measurement of the signal power applied to the sensor by the short circuiting in said circuit.

22. A method is claimed in claim 21 and in which said providing comprises dissipating the signal power applied to move said conductor of the sensor as counter magnetic field forces are developed by the short-circuited sensor conductor in a manner analogous to negative feedback, and damping the movement of said conductor so that the conductor stops the moment the signal forces cease to be applied, thereby linearizing the operation and extending bandwidth of the measurement.

23. In an electronic amplifier apparatus comprising a pair of differencing amplifier circuits connected to receive signal from and to feedback to respective electronic switching devices to provide a pair of inputs for low impedance signal source connection, a method of enabling low-noise current amplification of signals from low impedance source means, that comprises, passing equal but opposite currents with the correlated noise from a common source in opposite directions through each of the switching devices to produce minimal resultant uncorrelated noise therein, and superimposing a signal from said low impedance source means as an increment to the current through each device of magnitude much smaller than said opposite currents passed through the respective device.

24. In an electronic amplifier apparatus comprising a differencing amplifier circuit of the operational amplifier type connected to receive signal from and to feedback to an electronic switching device of the solid state type having electrodes of the base, collector and emitter types, a method of enabling low-noise current amplification of a signal from a low impedance source means, that comprises, passing equal but opposite currents with the correlated noise from a common source in opposite directions through the switching device to produce minimal resultant uncorrelated noise therein, by passing current from said common source in one direction through the device between the emitter and collector and by passing through the device an opposite current fed back from said differencing amplifier circuit and forced in the opposite direction through the device, and superimposing the signal from said low impedance source means as an increment to the current through said device of magnitude much smaller than said opposite currents by applying said signal between the emitter and a noiseless reference connected to the base, thereby rendering the operational amplifier a low noise inverting amplifier.

25. A method is claimed in claim 24 including effectively clamping the emitter and collector and clamping the base to ground, and operating said device in a pure current mode having only substantially the noise of the emitter junction and the base spreading resistance.

26. A low noise amplifier apparatus having, in combination, a pair of differencing amplifier means each having inputs and an output, a pair of electronic switching means each having at least three electrodes comprising input and output terminals, said switching means being associated with said amplifier means, respectively, means for connecting the output terminals of the switching means to the inputs of the associated amplifier means with a feedback connection from the output of each amplifier means to the input terminals of the associated electronic switching means, means for applying equal and opposite currents to the input and output terminals of each switching means from a common source means to force equal and opposite currents with the same correlated noise in opposite directions through each of the switching means to produce minimal resultant uncorrelated noise therein, and means for connecting low impedance signal source means with the input terminals of the switching means to superimpose a signal as an increment to the currents forced through the switching means of magnitude much smaller than said opposite currents for low-noise amplification by the amplifier means.

27. In an electronic amplifier apparatus comprising a differencing amplifier circuit connected to receive signal from and to feedback to a electronic switching device, a method of enabling low-noise current amplification of a signal from low impedance source means with a sensor of the type having a moving conductor in a magnetic field for sensing applied signal forces, that comprises, passing equal but opposite currents with the correlated noise from a common source in opposite directions through the switching device to produce minimal resultant uncorrelated noise therein, and superimposing the signal from said low impedance source means as an increment to the current through said device of magnitude much smaller than said opposite currents, said superimposing comprising connecting the electronic switching device to the sensor so as effectively to short circuit the sensor, thereby providing a measurement of the signal power applied to the sensor and short-circuited through said switching device.

* * * * *